US007239178B1

(12) United States Patent
Cornell et al.

(10) Patent No.: US 7,239,178 B1
(45) Date of Patent: Jul. 3, 2007

(54) CIRCUIT AND METHOD FOR CMOS VOLTAGE LEVEL TRANSLATION

(75) Inventors: Charles A. Cornell, Austin, TX (US); Matthew S. Berzins, Cedar Park, TX (US); Stephen M. Prather, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 173 days.

(21) Appl. No.: 11/090,935

(22) Filed: Mar. 23, 2005

Related U.S. Application Data

(60) Provisional application No. 60/555,894, filed on Mar. 23, 2004.

(51) Int. Cl.
*H03K 19/0175* (2006.01)
(52) U.S. Cl. .......................................... 326/81; 326/68
(58) Field of Classification Search .................. 326/81, 326/80, 62, 63, 68
See application file for complete search history.

(56) References Cited

U.S. PATENT DOCUMENTS

| 4,835,419 | A | * | 5/1989 | Chappell et al. ............... 326/73 |
| 5,036,226 | A | * | 7/1991 | Tonnu et al. .................. 326/71 |
| 5,160,854 | A | * | 11/1992 | Martignoni et al. ......... 327/108 |
| 5,955,893 | A | * | 9/1999 | Chang et al. .................. 326/71 |

* cited by examiner

*Primary Examiner*—James H. Cho
(74) *Attorney, Agent, or Firm*—Marger Johnson & McCollom P.C.

(57) ABSTRACT

A voltage level translation circuit includes a first power supply voltage, a second power supply voltage, wherein the second supply voltage is lower than the first supply voltage, a low voltage input, wherein the low voltage input is referenced from the second supply voltage, a resistive element leaker transistor having a source and a drain, wherein the source is coupled to the first power supply voltage, a PMOSFET having a gate and a source, wherein the source is coupled to the first power supply voltage, and a pulse generator coupled to the gate of the PMOSFET, wherein the pulse generator is capable of controlling the operation of the PMOSFET.

14 Claims, 3 Drawing Sheets

CIRCUIT AND METHOD FOR CMOS VOLTAGE LEVEL TRANSLATION

CROSS REFERENCE TO RELATED APPLICATIONS

This application claims the benefit of U.S. Provisional Application No. 60/555,894, filed on 23 Mar. 2004, the disclosure of which is hereby incorporated by reference in its entirety.

BACKGROUND OF THE INVENTION

1. Technical Field of the Invention

This disclosure relates generally to electronic circuits, and more particularly, to complimentary metal oxide silicon (CMOS) voltage level translation circuits.

2. Description of the Related Art

For purposes of this disclosure, a voltage level translation circuit is defined as a circuit that transforms an input signal having a first amplitude swing range into an output signal having a second amplitude swing range, the first and second amplitude swing ranges being different.

Voltage level translation circuits are typically used when the core of a chip operates at a voltage that is different (usually lower) than that of the input/output buffers. In the case of CMOS logic the logical one signal levels generated by logic connected to the supply with the lower voltage are not sufficient to turn off the gates of P-channel Metal-Oxide-Semiconductor (PMOS) devices whose sources are connected to the supply with the higher voltage. This scenario leads to substantial wasted current dissipation on the supply with the higher voltage.

FIG. 1 is a circuit diagram illustrating a conventional voltage level translation circuit 100. The voltage level translation circuit 100 includes an input signal IN coupled to the gate of a first transistor N1 and to the input of an inverter I1, where the output of the inverter is coupled to the gate of a second transistor N2. The voltage level translation circuit 100 further includes a third transistor P1 and a fourth transistor P2 having cross-coupled gates and drains, wherein the drain of the third transistor P2 is coupled to the source of the first transistor, and the drain of the fourth transistor is coupled to the source of the second transistor. The output of the voltage level translation circuit 100 is coupled to the source of the second transistor N2.

The voltage level translation circuit 100 operates in the following manner. When the input is low, the third transistor P1 is on, the first transistor N1 is off, the fourth transistor P2 is off, and the third transistor P1 holds out low. When the input transitions from low to high, the first transistor N1 turns on immediately, fighting the third transistor P1, the second transistor N2 turns off, and the fourth transistor P2 turns on weakly to pull out high and turn off the third transistor P1.

When the input is high, the third transistor P1 is off, the first transistor N1 is on, the fourth transistor P2 holds out high, and the second transistor N2 is off. When the input goes from high to low the first transistor N1 turns off immediately, the second transistor N2 turns on, fighting the fourth transistor P2, and starts pulling low. The third transistor P1 turns on weakly (because it is pulled down) and turns the fourth transistor P2 off.

Disadvantages of the conventional voltage level translation circuit 100 include, depending upon the exact implementation, a greater duty cycle distortion (DCD) or a longer latency, or both, than what may be desired by a user. This distortion and latency results from the contention (fighting) in the speed path, as was described above.

Embodiments of the invention address these and other disadvantages of the conventional art.

SUMMARY OF THE INVENTION

According to embodiments of the invention, a method and circuit are described to level translate a lower voltage full swing signal into a higher voltage full swing signal with minimum latency.

DETAILED DESCRIPTION OF THE INVENTION

Figure 1:
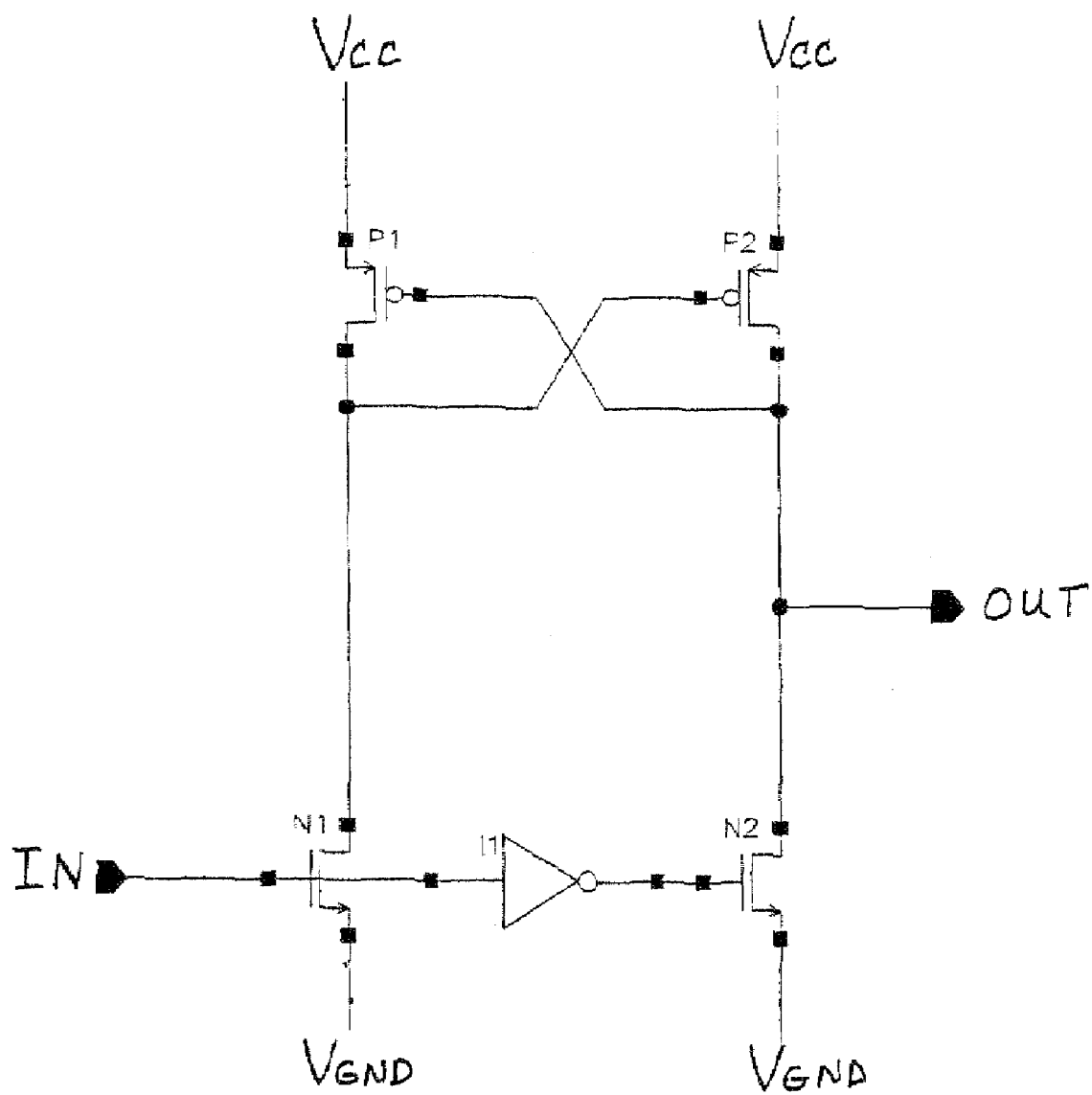
FIG. 1 is a circuit diagram illustrating a conventional voltage level translation circuit.
Figure 2:
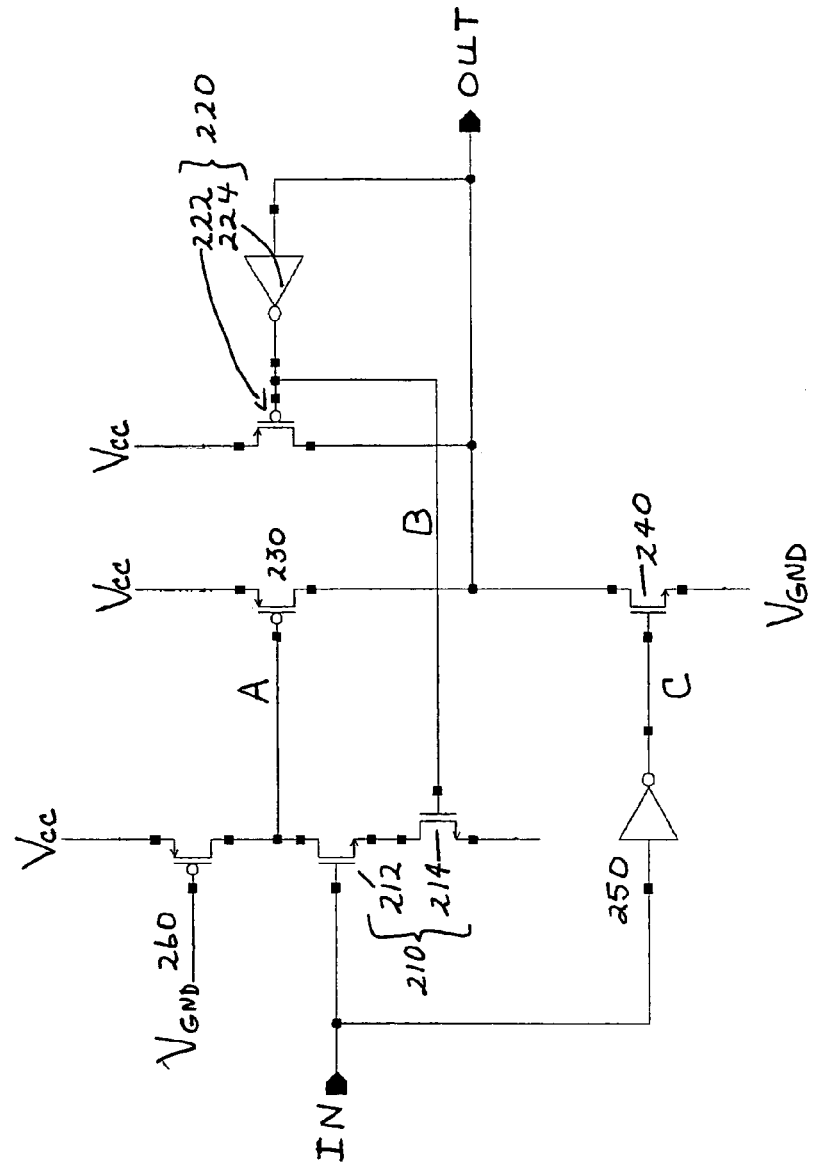
FIG. 2 is a circuit diagram illustrating a voltage level translation circuit according to some embodiments of the invention, the circuit having an improved duty cycle distortion and latency compared to the conventional circuit.

FIG. 2 is a circuit diagram illustrating a voltage level translation circuit 200 according to some embodiments of the invention, the circuit having an improved duty cycle distortion and latency compared to the conventional circuit described above.

The voltage level translation circuit 200 includes an N-channel Field Effect Transistor (NFET) stack 210 that consists of N-channel Metal-Oxide-Semiconductor (NMOS) transistors 212 and 214, a keeper latch 220 that consists of a PMOS transistor 222 and an inverter 224, a PMOS transistor 230, a NMOS transistor 240, an inverter 250, and a resistive element leaker transistor 260.

The sources of PMOS transistor 222, PMOS transistor 230, and resistive element leaker transistor 260 are coupled to a supply voltage $V_{CC}$, while the drains of NMOS transistors 214 and 240 are coupled to a reference voltage $V_{GND}$. The gate of the resistive element leaker transistor 260 is coupled to the reference voltage $V_{GND}$. An input signal IN is applied to the gate of the NMOS transistor 212 and is inverted by inverter 250 and applied to the gate of NMOS transistor 240. The gates of the PMOS transistor 222 and NMOS transistor 214 are coupled, while the circuit node between PMOS transistor 260 and NMOS transistor 212 is coupled to the gate of PMOS transistor 230. The drains of PMOS transistors 222 and 230 are coupled to the source of NMOS transistor 240.

The output drive stage of the voltage level translation circuit 200 consists of the PMOS transistor 230 and the NMOS transistor 240.

The resistive element leaker transistor 260, the NFET stack 210, the PMOS transistor 230, and the inverter 224 form a feedback loop that constitutes a self-timed pulse generator circuit that controls the gate of the PMOS transistor 230.

During the propagation of a high to low transition, the voltage level translation circuit 200 operates in the following manner. In response to the signal IN at a low level, the circuit node C is pulled high by the inverter 250. Next, the transistor 240 turns on and pulls the translation circuit output OUT low. Then, the inverter 224 pulls the circuit node B high.

This causes the NMOS transistor 214 to turn on, enabling the generation of a pulse on circuit node A when the input IN returns to a high level.

During the propagation of a low to high transition, the voltage level translation circuit 200 operates in the following manner. Initially, the NFET stack consisting of the NMOS transistors 212 and 214 turns on and pulls the circuit node A low. Next, the PMOS transistor 230 turns on, pulling the voltage level translation circuit output OUT high. Then, the circuit node B is pulled low by the inverter 224. This causes the PMOS transistor 222 of the PMOS latch 220 to turn on and hold the translation circuit output OUT high. Next, the NMOS transistor 214 turns off, allowing the node A to leak high.

Thus, according to these embodiments of the invention, the voltage level translation circuit 200 includes a resistive element leaker transistor 260 to the higher voltage supply and a self-timed pulse generator circuit, both of which are used to drive the gate of the PMOS transistor 230. The resistive element leaker transistor 260 is used to turn the PMOS transistor 230 off while the pulse generator circuit is used to turn the PMOS transistor 230 on. The voltage level translation circuit 200 further includes a keeper latch 220 consisting of a PMOS transistor 222 and an inverter 224 to hold the high state on the output.

A delay chain portion of the voltage level translation circuit 200, that is, the portion of the circuit that determines when the PMOS transistor 230 turns off, includes the drive stage (PMOS transistor 230) and the inverter 224 of the keeper latch 220. Because the delay chain contains the PMOS transistor 230, the pulse is self-timed and the basic function of the voltage level translation circuit 200 is not sensitive to the amount of load on the output node OUT. If more load is present, the PMOS transistor 230 will not raise the output node OUT as quickly, thereby lengthening the pulse. However, the propagation delay through the circuit is sensitive to the output load.

All devices in the speed path of the voltage level translation circuit 200, that is, all devices that are between an input transition and an output transition, are large enough to drive their loads at optimum speed. Two CMOS stages are used for both rising and falling transitions.

Figure 3:
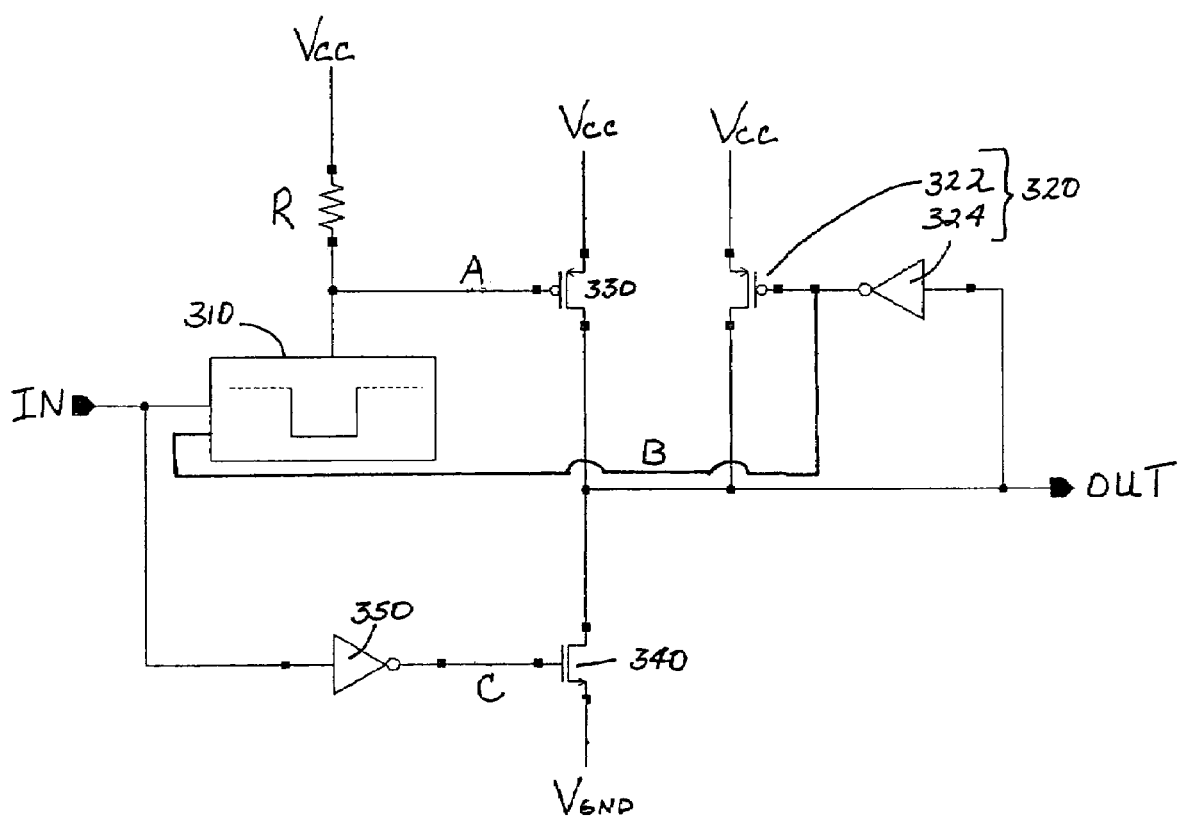
FIG. 3 is a generalized circuit diagram illustrating a voltage level translation circuit according to embodiments of the invention.

FIG. 3 is a generalized circuit diagram illustrating a voltage level translation circuit 300 according to embodiments of the invention.

The voltage level translation circuit 300 includes a pulse generator 310, a keeper latch 320 that consists of a PMOS transistor 322 and an inverter 324, a PMOS transistor 330, a NMOS transistor 340, an inverter 350, and a resistive element R. Generally speaking, the resistive element R may be a passive device, such as a resistor, or an active device, such as a transistor.

The sources of PMOS transistors 322, 330 are coupled to a supply voltage $V_{CC}$, as is an end of the resistive element R. The drain of NMOS transistor 340 is coupled to a reference voltage $V_{GND}$. An input signal IN is applied to the pulse generator 310 and is inverted by inverter 350 and applied to the gate of NMOS transistor 340. The circuit node between the resistive element R and the pulse generator 310 is coupled to the gate of PMOS transistor 330. The drains of PMOS transistors 322 and 330 are coupled to the source of NMOS transistor 340. The pulse generator 310 is responsive both to the input signal IN as well as the output of the inverter 324.

The output drive stage of the voltage level translation circuit 300 consists of the PMOS transistor 330 and the NMOS transistor 340.

The resistive element R, the pulse generator 310, the PMOS transistor 330, and the inverter 324 form a feedback loop that constitutes a self-timed pulse generator circuit that controls the gate of the PMOS transistor 330.

During the propagation of a high to low transition, the voltage level translation circuit 300 operates in the following manner. In response to the signal IN at a low level, the circuit node C is pulled high by the inverter 350. Next, the transistor 340 turns on and pulls the voltage level translation circuit output OUT low. Then, the inverter 324 pulls the circuit node B high. This enables the pulse generator 310 to produce a pulse on circuit node A when the input IN returns to a high level.

During the propagation of a low to high transition, the voltage level translation circuit 300 operates in the following manner. Initially, the pulse generator 310 turns on and pulls the circuit node A low. Next, the PMOS transistor 230 turns on, pulling the voltage level translation circuit output OUT high. Then, the circuit node B is pulled low by the inverter 324. This causes the PMOS transistor 322 of the PMOS latch 320 to turn on and hold the voltage level translation circuit output OUT high. Next, the pulse generator 310 turns off, allowing the node A to leak high.

Thus, according to these embodiments of the invention, the voltage level translation circuit 300 includes a resistive element R to the higher voltage supply and a self-timed pulse generator circuit, both of which are used to drive the gate of the PMOS transistor 230. The resistive element R is used to turn the PMOS transistor 330 off while the self-timed pulse generator circuit is used to turn the PMOS transistor 330 on. The voltage level translation circuit 300 further includes a keeper latch 320 consisting of a PMOS transistor 322 and an inverter 324 to hold the high state on the output.

A delay chain portion of the voltage level translation circuit 300, that is, the portion of the circuit that determines when the PMOS transistor 330 turns off, includes the drive stage (PMOS transistor 330) and the inverter 324 of the keeper latch 320. Because the delay chain contains the PMOS transistor 330, the pulse is self-timed and the basic function of the circuit 300 is not sensitive to the amount of load on the output node OUT. If more load is present, the PMOS transistor 330 will not raise the output node OUT as quickly, thereby lengthening the pulse. However, the propagation delay through the circuit is sensitive to the output load.

All devices in the speed path of the voltage level translation circuit 300, that is, all devices that are between an input transition and an output transition, are large enough to drive their loads at optimum speed. Two CMOS stages are used for both rising and falling transitions.

According to some alternative embodiments of the invention, a voltage level translation circuit may include a pulse generator that does not utilize self-timing. As mentioned above, without self-timing the voltage level translation circuit is very sensitive to the load placed on the output node OUT. Therefore, according to these embodiments of the invention, the pulse must be closely tailored to the load that is driven.

Advantages of the circuit and method according to embodiments of the invention include lower latency and reduced duty cycle distortion compared to the conventional solution. In addition, the improved circuit and method yields duty cycle distortion comparable to CMOS logic. Voltage level translation circuits according to embodiments of the invention may be used anywhere a full swing lower voltage (for example, 1.8V) signal needs to feed into a circuit requiring a full swing higher voltage (for example, 3.3V) signal.

The invention may be practiced in many ways. What follows are exemplary, non-limiting descriptions of some embodiments of the invention.

According to some embodiments, a voltage level translation circuit includes a resistive element configured to be coupled to a power supply voltage, a pulse generator responsive to an input signal having a first amplitude swing range, the pulse generator coupled to the resistive element, and a drive stage coupled to the resistive element and the pulse generator, the drive stage configured to produce an output signal having a second amplitude swing range, the second amplitude swing range different than the first amplitude swing range.

According to some embodiments, the voltage level translation circuit further includes a latch, the latch configured to hold the output signal at a high level in response to a low to high transition of the input signal.

According to some embodiments, the latch includes a first PMOS transistor, the first PMOS transistor having a source coupled to the power supply voltage and a drain coupled to the output signal; and an inverter, the inverter coupled between the output signal and a gate of the first PMOS transistor, the pulse generator responsive to an output of the inverter.

According to some embodiments, the pulse generator includes a first NMOS transistor having a gate coupled to the input signal and a source coupled to the drive stage; and a second NMOS transistor having a gate coupled to the output of the inverter, having a source coupled to a drain of the first NMOS transistor, and having a drain coupled to a reference voltage.

According to some embodiments, the drive stage includes a second PMOS transistor, the second PMOS transistor having a source coupled to the power supply voltage and having a gate coupled to the resistive element and the pulse generator; and a third NMOS transistor, the third NMOS transistor having a source coupled to a drain of the second PMOS transistor and a drain configured to be coupled to the reference voltage.

According to some embodiments, the resistive element, the pulse generator, the second PMOS transistor, and the inverter form a feedback loop that constitutes a self-timed pulse generator circuit configured to control the gate of the second PMOS transistor.

According to some embodiments, the resistive element includes a transistor having a gate that is configured to be coupled to a reference voltage.

According to some embodiments, the resistive element includes a resistor.

According to other embodiments of the invention, a voltage level translation circuit includes a first supply voltage; a second supply voltage, the second supply voltage less than the first supply voltage; a low voltage input, wherein the low voltage input is referenced from the second supply voltage; a resistive element leaker transistor having a source and a drain, the source coupled to the first supply voltage; a first PMOS transistor having a gate and a source, the source coupled to the first supply voltage; and a pulse generator coupled to the gate of the PMOS transistor, wherein the pulse generator is capable of controlling the operation of the PMOS transistor.

According to some embodiments, the voltage level translation circuit further includes a self-timed delay element configured to determine the width of the falling pulse at the drain of the leaker transistor.

According to some embodiments, the pulse generator includes a NFET stack consisting of two NMOS transistors, a gate of one of the NMOS transistors coupled to the low voltage input and a source of the one of the NMOS transistors coupled to the gate of the first PMOS transistor.

According to some embodiments, the voltage level translation circuit further includes a latch having a second PMOS transistor and an inverter, a gate of the other one of the NMOS transistors coupled to a circuit node between a gate of the second PMOS transistor and an output of the inverter.

According to some embodiments, the self-timed delay element includes the first PMOS transistor and the inverter.

According to some embodiments, the voltage level translation circuit is structured to lengthen a propagation delay through the circuit in response to an amount of load on an output node of the circuit.

According to some embodiments, the voltage level translation circuit further includes a first NMOS transistor having a source coupled to a drain of the first PMOS transistor, and having a drain coupled to the second supply voltage.

According to some embodiments, the voltage level translation circuit further includes an inverter coupled between a gate of the first NMOS transistor and the low voltage input.

According to other embodiments of the invention, a method of voltage level translation includes controlling a drive stage of a voltage level translation circuit with a pulse generator and a resistive element.

According to some embodiments, controlling the drive stage includes implementing a self-timed pulse generator circuit.

According to some embodiments, implementing a self-timed pulse generator circuit comprises implementing a feedback loop in the voltage level translation circuit, the feedback loop including the pulse generator, the resistive element, a transistor in the drive stage, and an inverter in a latch circuit, the latch circuit structured to hold an output of the voltage level translation circuit at a high level.

According to some embodiments, controlling the drive stage further includes turning off the transistor using the resistive element; and turning on the transistor using the self-timed pulse generator circuit.

It should be appreciated that reference throughout this specification to "one embodiment" or "an embodiment" means that a particular feature, structure or characteristic described in connection with the embodiment is included in at least one embodiment of the present invention. Therefore, it should be emphasized and appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Having described and illustrated the principles of the invention in a several preferred embodiments, it should be apparent that the embodiments may be modified in arrangement and detail without departing from such principles. We claim all modifications and variation coming within the spirit and scope of the following claims.

The invention claimed is:

1. A voltage level translation circuit comprising:
   a resistive element configured to be coupled to a power supply voltage;
   a pulse generator responsive to an input signal having a first amplitude swing range, the pulse generator coupled to the resistive element; and
   a drive stage coupled to the resistive element and the pulse generator, the drive stage configured to produce an output signal having a second amplitude swing range, the second amplitude swing range different than the first amplitude swing range; and
   a latch configured to hold the output signal at a high level in response to a low to high transition of the input signal;
   the latch comprising:
      a first P-channel Metal-Oxide-Semiconductor Field Effect Transistor (PMOSFET), the first PMOSFET having a source coupled to the power supply voltage and a drain coupled to the output signal; and
      an inverter, the inverter coupled between the output signal and a gate of the first PMOSFET transistor, the pulse generator responsive to an output of the inverter.

2. The circuit of claim 1, the pulse generator comprising:
   a first N-channel Metal-Oxide-Semiconductor Field Effect Transistor (NMOSFET) having a gate coupled to the input signal and a source coupled to the drive stage; and
   a second NMOSFET having a gate coupled to the output of the inverter, having a source coupled to a drain of the first NMOSFET, and having a drain coupled to a reference voltage.

3. The circuit of claim 2, the drive stage comprising:
   a second PMOSFET, the second PMOSFET having a source coupled to the power supply voltage and having a gate coupled to the resistive element and the pulse generator; and
   a third NMOSFET, the third NMOSFET having a source coupled to a drain of the second PMOSFET and a drain configured to be coupled to the reference voltage.

4. The circuit of claim 3, the resistive element, the pulse generator, the second PMOSFET, and the inverter forming a feedback loop that constitutes a self-timed pulse generator circuit configured to control the gate of the second PMOSFET.

5. The circuit of claim 1, the resistive element comprising a transistor having a gate that is configured to be coupled to a reference voltage.

6. The circuit of claim 1, the resistive element comprising a resistor.

7. A voltage level translation circuit comprising:
   a first supply voltage;
   a second supply voltage, the second supply voltage less than the first supply voltage;
   a low voltage input, wherein the low voltage input is referenced from the second supply voltage;
   a resistive element leaker transistor having a source and a drain, the source coupled to the first supply voltage;
   a first P-channel Metal-Oxide-Semiconductor Field Effect Transistor (PMOSFET) having a gate and a source, the source coupled to the first supply voltage;
   a pulse generator coupled to the gate of the first PMOSFET, wherein the pulse generator is capable of controlling the operation of the first PMOSFET; and
   a self-timed delay element configured to determine the width of the falling pulse at the drain of the resistive element leaker transistor.

8. The circuit of claim 7, the pulse generator comprising a stack consisting of two N-channel Metal-Oxide-Semiconductor Field Effect Transistors (NMOSFETs), a gate of one of the NMOSFETs coupled to the low voltage input and a source of the one of the NMOSFET's coupled to the gate of the first PMOSFET.

9. The circuit of claim 8, further comprising a latch having a second PMOSFET and an inverter, a gate of the other one of the NMOSFETs coupled to a circuit node between a gate of the second PMOSFET and an output of the inverter.

10. The circuit of claim 9, the self-timed delay element including the first PMOSFET and the inverter.

11. A voltage level translation circuit comprising:
    a first supply voltage;
    a second supply voltage, the second supply voltage less than the first supply voltage;
    a low voltage input, wherein the low voltage input is referenced from the second supply voltage;
    a resistive element leaker transistor having a source and a drain, the source coupled to the first supply voltage;
    a first P-channel Metal-Oxide-Semiconductor Field Effect Transistor (PMOSFET) having a gate and a source, the source coupled to the first supply voltage; and
    a pulse generator coupled to the gate of the first PMOSFET, wherein the pulse generator is capable of controlling the operation of the first PMOSFET;
    where the circuit is structured to lengthen a propagation delay through the circuit responsive to an amount of load on an output node of the circuit.

12. The circuit of claim 11, further comprising an inverter coupled between a gate of the first NMOSFET and the low voltage input.

13. A method of voltage level translation, comprising:
    controlling a drive stage of a voltage level translation circuit with a pulse generator and a resistive element;
    implementing a self-timed pulse generator circuit; and
    implementing a feedback loop in the voltage level translation circuit, the feedback loop including the pulse generator, the resistive element, a transistor in the drive stage, and an inverter in a latch circuit, the latch circuit structured to hold an output of the voltage level translation circuit at a high level.

14. The method of claim 13, wherein controlling the drive stage further comprises:
    turning off the transistor using the resistive element; and
    turning on the transistor using the self-timed pulse generator circuit.

* * * * *